(12) United States Patent
Chen et al.

(10) Patent No.: US 6,215,131 B1
(45) Date of Patent: Apr. 10, 2001

(54) LIGHT-EMITTING DEVICE USING VACUUM DOUGHNUT TO SERVE AS A CURRENT BLOCKING LAYER

(75) Inventors: Jian-Tin Chen, Taipei; Wei-Chih Lai, Hsinchu Hsien; Tsong-Yu Chen, Keelung, all of (TW)

(73) Assignee: Advanced Epitaxy Technology Inc., Hsinchu Industrial Park (TW)

( * ) Notice: Subject to any disclaimer, the term of this patent is extended or adjusted under 35 U.S.C. 154(b) by 0 days.

(21) Appl. No.: 09/372,449

(22) Filed: Aug. 11, 1999

(51) Int. Cl.$^7$ .................................................. H01L 27/15
(52) U.S. Cl. ................ 257/85; 257/79; 257/90; 257/96; 257/183
(58) Field of Search ............... 257/79, 90, 94, 257/96, 183

(56) References Cited

U.S. PATENT DOCUMENTS 5,300,791 * 4/1994 Chen et al. .......................... 257/94
5,814,838 * 9/1998 Ohtsuka et al. ...................... 257/94

* cited by examiner

Primary Examiner—Olik Chaudhuri
Assistant Examiner—Wai-Sing Louie
(74) Attorney, Agent, or Firm—Christensen O'Connor Johnson Kindness PLLC

(57) ABSTRACT

A light-emitting device using a vacuum doughnut to serve as a current blocking layer is disclosed. The light-emitting device comprises: a substrate of a first conductivity type; a buffer layer formed on the substrate; a double heterostructure layer comprising a first cladding layer, an active layer and a second cladding layer, formed on the buffer layer; and a cap layer of a second conductivity type formed on the double heterostructure layer. A vacuum doughnut is formed between the active layer and an electrode formed on the cap layer to block a current flowing from the electrode formed on the cap layer so that the current flows through a region of the double heterostructure layer that is uncovered by the electrode. Furthermore, the vacuum doughnut can also be formed in the second cladding layer instead of forming in the cap layer.

17 Claims, 4 Drawing Sheets

LIGHT-EMITTING DEVICE USING VACUUM DOUGHNUT TO SERVE AS A CURRENT BLOCKING LAYER

BACKGROUND OF THE INVENTION

1. Field of the Invention

This invention relates to a semiconductor light-emitting device, and particularly to a light-emitting device using a vacuum doughnut to serve as a current blocking layer.

2. Description of Prior Art

Generally speaking, light-emitting diodes that are characterized by a double heterojunction have low luminous efficiencies because of contact shadowing caused by current crowding at the p-n junction of the diode under the contact area. Referring to FIG. 1, a conventional light-emitting diode comprises a substrate 10, a buffer layer 12, a double heterostructure 14, a cap layer 16 and metal contacts 18a and 18b. As external contact is made to the structure through the metal contact 18b, light is emitted along the double heterostructure 14. However, the light emitted along the double heterostructure 14 under the contact 18b is absorbed or reflected by the contact, which in effect acts as a shadow to a portion of the light being emitted from the entire double heterostructure, thus reducing the total external light output. Therefore, in order to increase the output of the light being emitted along the entire double heterostructure of the diode, it is essential to minimize contact shadowing beneath the contact area.

SUMMARY OF THE INVENTION

Accordingly, the object of this invention is to provide a light-emitting device using a vacuum doughnut to serve as a current-blocking layer. The light emitted by the active region can be effectively outputted to the exterior, and thus the light efficiency of the light-emitting device is improved.

The vacuum doughnut can be formed in an epitaxial layer between the active layer and the upper electrode. It is not necessary to form a layer of semiconductor material or oxide to serve as a current-blocking layer in this invention, thus the structure and the manufacturing process of the light-emitting device can be simplified.

This invention forms a vacuum doughnut directly beneath the electrode so as to avoid useless current injection into the region directly beneath the electrode.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

Figure 2A:
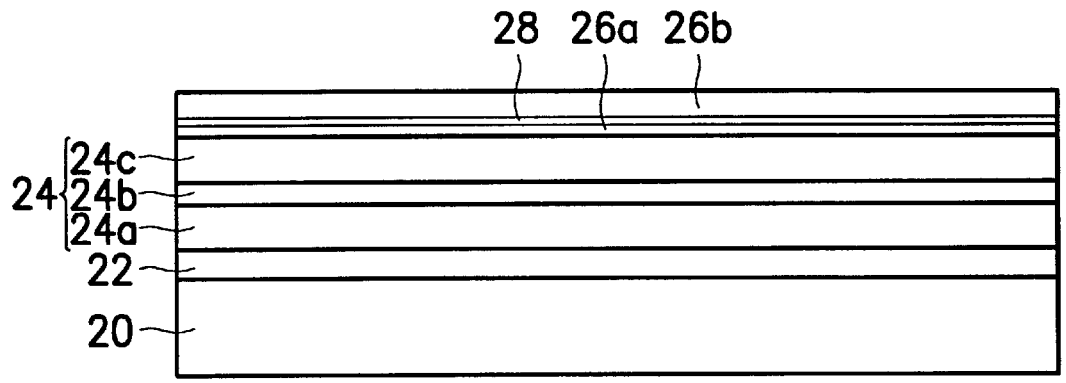
FIGS. 2a to 2e illustrate the process of manufacturing a light-emitting device according to this invention.
Figure 2B:
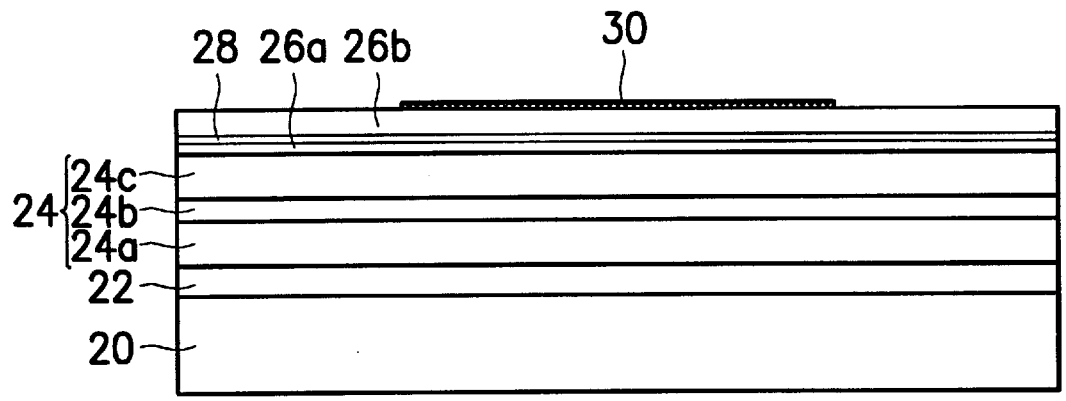
Figure 2C:
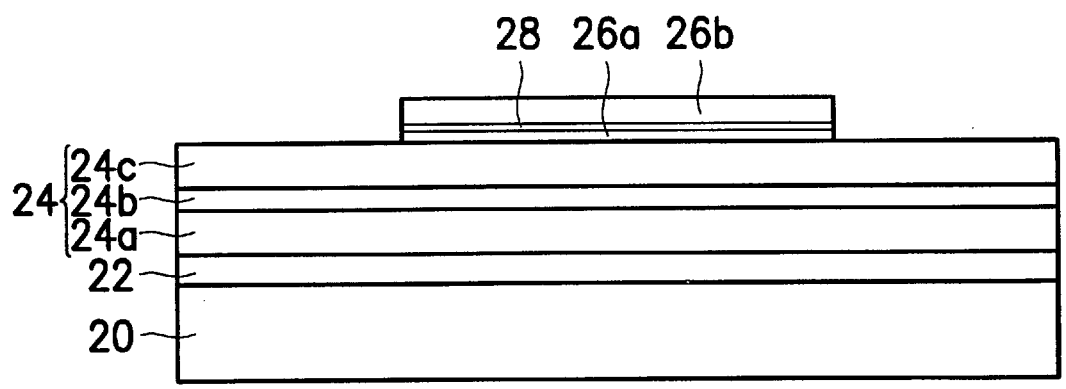
Figure 2D:
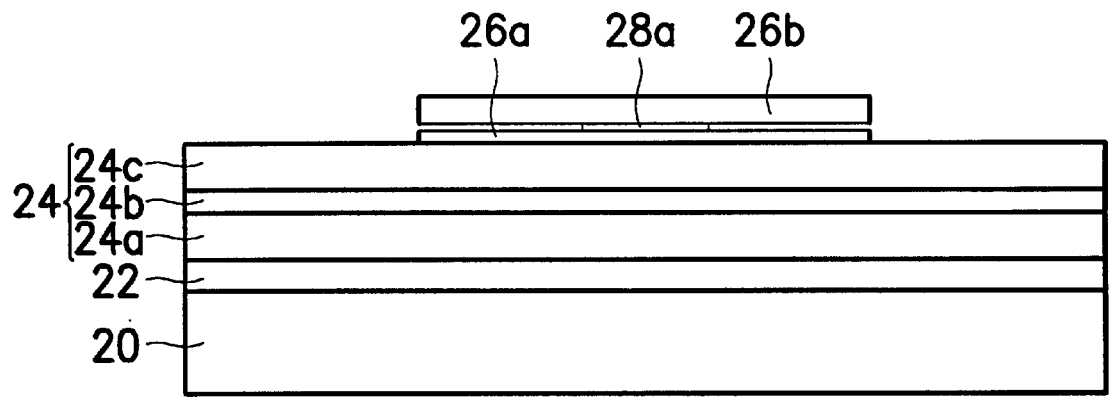
Figure 2E:
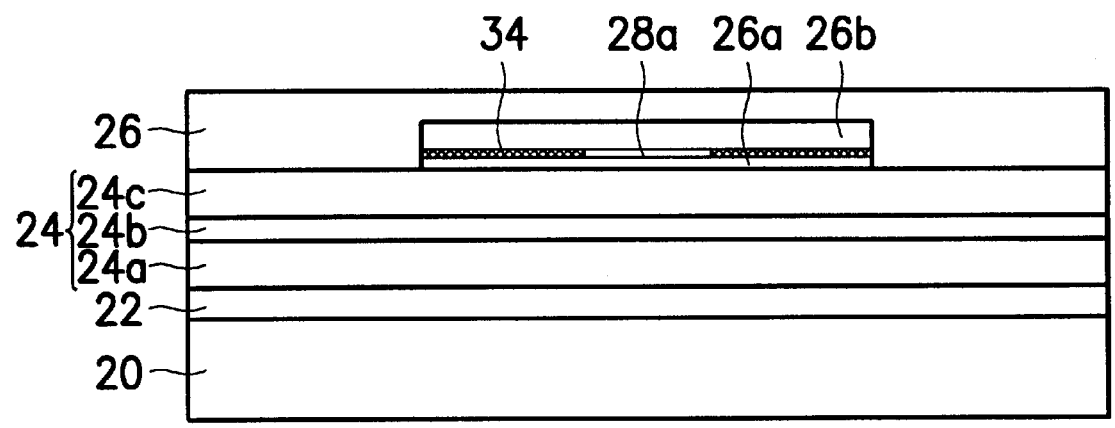

Referring to FIGS. 2a to 2e, the method of manufacturing the light-emitting device of this invention comprises the steps of: (i) sequentially forming a buffer layer 22 and a double heterostructure layer 24 on a substrate 20, as shown in FIG. 2a, and then forming a cap layer 26 on the double heterostructure layer 24, wherein the cap layer 26 is formed to protect the double heterostructure layer from natural oxidation and is heavily doped for easily ohmic contact, and a layer 28 that can be easily etched is formed into the cap layer 26 and divides the cap layer to an upper portion 26b and a lower portion 26a; (ii) referring to FIG. 2b, forming a layer of photoresist or hard mask 30 on a predetermined region of the cap layer 26; (iii) referring to FIG. 2c, etching the cap layer 26 that is not covered by the photoresist or hard mask 30; (iv) referring to FIG. 2d, selectively etching the circumference portion of the layer 28 formed in the cap layer 26 to leave a central portion 28a of the layer formed in the cap layer so that the upper portion 26b of cap layer and the lower portion 26a of cap layer are spaced apart and only connected by the central portion 28a of the layer formed in the cap layer; (v) referring to FIG. 2e, regrowing the cap layer 26 thereon so that a vacuum doughnut 34 is formed in the cap layer 26.

In the above process, the vacuum doughnut layer formed in the cap layer can be AlInP, AlAs, GaInP, GaAs, InAlAs, InAlGaAs, InGaAsP, InP or another material which can be etched easier than the cap layer. The vacuum doughnut layer can be thick enough to be etched away by etching solvent. The selectively etching solvent can be an acid solution such as HCl, $HNO_3$, $H_2SO_4$ for AlInP and AlAs; a solution of $H_2O_2$ and acid for GaInP; a solution of $C_6H_8O_7/H_2O_2$ or $NH_4OH/H_2O_2$ for GaAs; a solution of HCl for InAlAs; a solution of $H_3PO_4/H_2O_2$ for InAlGaAs; a solution of HCl/$H_3PO_4/H_2O_2$ for InGaAsP and a solution of HCl/$H_2O_2$ for InP.

Figure 1:
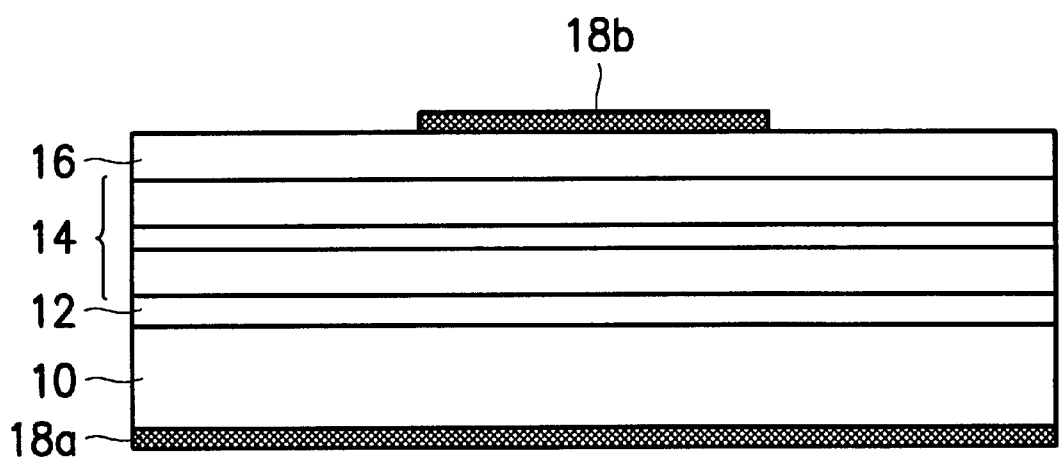
FIG. 1 is a diagram illustrating the structure of a conventional light-emitting device.
Figure 3:
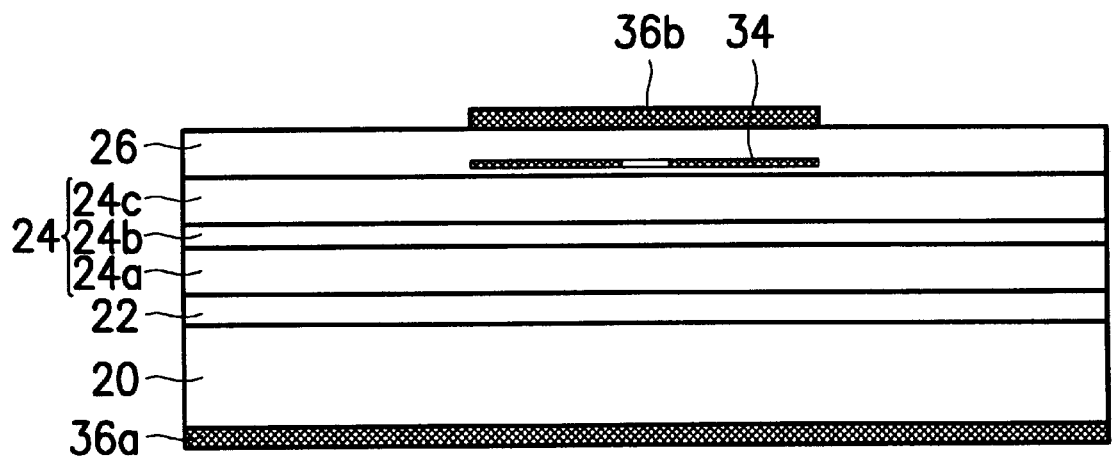
FIG. 3 is diagram illustrating the structure of a light-emitting device according to one embodiment of this invention.

Refer to FIG. 3, according to one embodiment of this invention, the light-emitting device comprises: a substrate 20 of a first conductivity type; a buffer layer 22 formed on the substrate 20; a double heterostructure layer 24 comprising a first cladding layer 24a, an active layer 24b and a second cladding layer 24c, formed on the buffer layer 22; and a cap layer 26 of a second conductivity type formed on the double heterostructure layer 24, in which a vacuum doughnut 34 is formed in the cap layer 26 to block a current flowing from an electrode 36b formed on the cap layer 26 so that the current flows through a region of the double heterostructure layer that is uncovered by the electrode 36b.

The substrate can be n-type GaAs. The double heterostructure layer can comprises an n-type AlGaInP cladding layer, an AlGaInP active layer and a p-type AlGaInP cladding layer; or an n-type AlGaAs cladding layer, an AlGaAs active layer and a p-type AlGaAS cladding layer. The cap layer can be a p-type GaP, GaAsP, GaInP, AlGaInP or AlGaAs layer.

Figure 4:
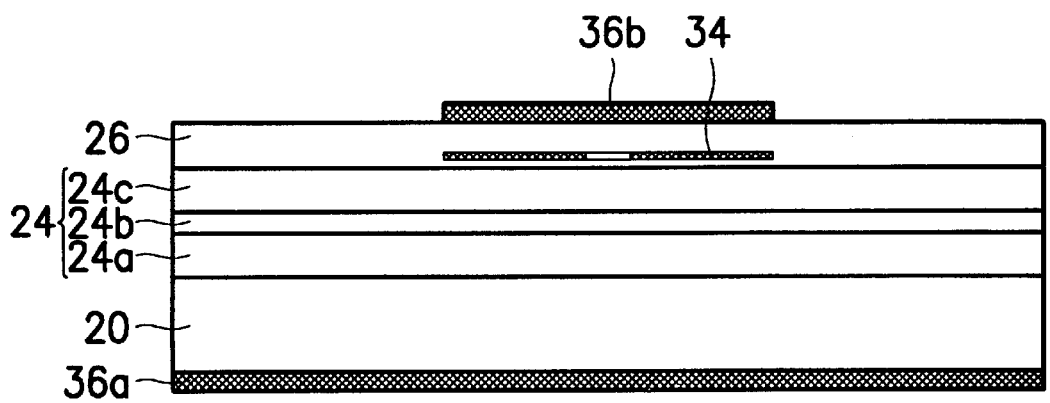
FIG. 4 is diagram illustrating the structure of a light-emitting device according to another embodiment of this invention.

In the above embodiments, the formation of the buffer layer is optional. Referring to FIG. 4, according to another embodiment of this invention, the light-emitting device comprises: a substrate 20 of a first conductivity type; a double heterostructure layer 24 comprising a first cladding layer 24a, an active layer 24b and a second cladding layer 24c, formed on the substrate 20; and a cap layer 26 of a second conductivity type formed on the double heterostructure layer 24, in which a vacuum doughnut 34 is formed in the cap layer 26 to block a current flowing from an electrode 36b formed on the cap layer 26.

The vacuum doughnut mentioned above can be a flatwise vacuum cavity of ring shape to achieve a better usage of the active regions not under the upper electrode. However, it can also be a flatwise vacuum cavity of any other shape formed between the active layer and the second electrode.

The invention has been described as a double heterostructure light-erhitting device. However, it is understood that the technique is suitable for single heterojunction light-emitting device.

Figure 5:
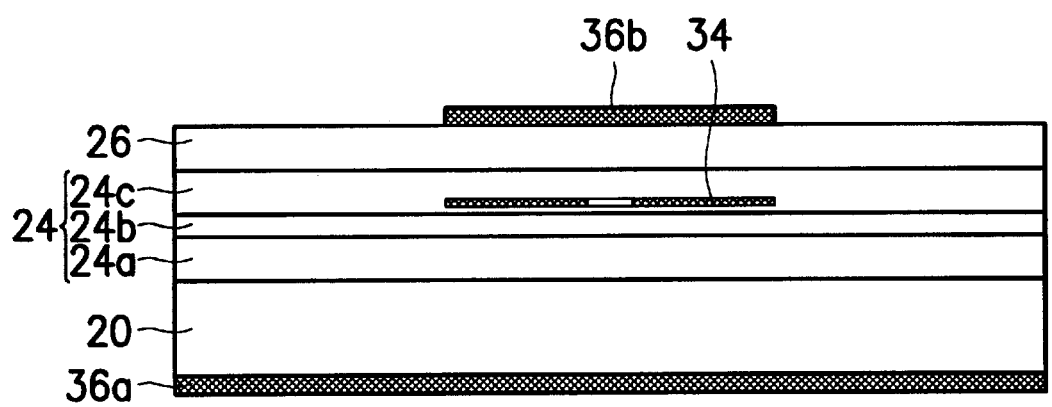
FIG. 5 is diagram illustrating the structure of a light-emitting device according to another embodiment of this invention.
Figure 6:
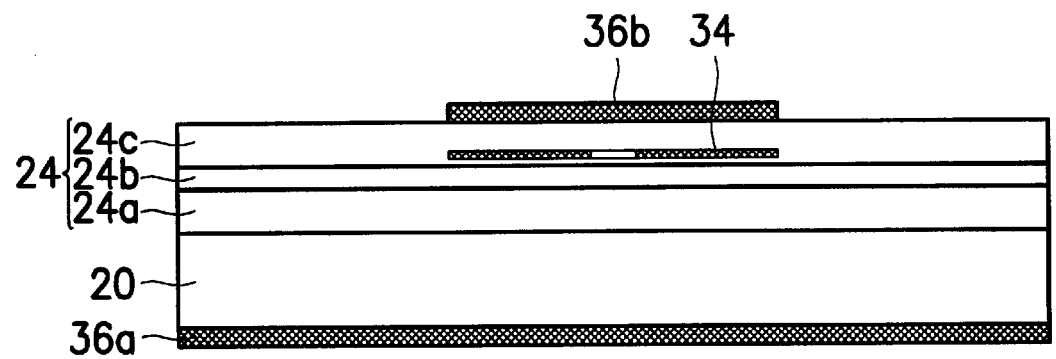
FIG. 6 is diagram illustrating the structure of a light-emitting device according to another embodiment of this invention.

Furthermore, instead of forming the vacuum doughnut in the cap layer, the vacuum doughnut can also be formed in the second cladding layer as shown in FIG. 5. In other words, in order to block the current flowing from the electrode formed on the cap layer, the vacuum doughnut serving as a current-blocking layer can be formed at any position between the active layer and the metal electrode. Further, the formation of a cap layer in the light-emitting device is optional. That is, as shown in FIG. 6, the light-emitting device of this invention can include only: a substrate 20 of a first conductivity type; a metal layer 36a formed on the substrate 20; and a double heterostructure layer 24 comprising a first cladding layer 24a, an active layer 24b and a second cladding layer 24c, formed on the substrate 20, in which a vacuum doughnut 34 is formed in the second cladding layer 24c to block a current flowing from an electrode 36b formed on the second cladding layer 24c.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A light-emitting device using a vacuum doughnut to serve as a current-blocking layer comprising:

a semiconductor substrate of a first conductivity type;

a first electrode contact to the substrate; double heterostructure layers comprising a first cladding layer, an active layer and a second cladding layer, sequentially formed on the other side of the substrate;

a cap layer of a second conductivity type formed on the double heterostructure layers;

a second electrode formed on the cap layer;

a vacuum doughnut comprising a flatwise vacuum cavity formed between the active layer and the second electrode.

2. A light-emitting device as claimed in claim 1, wherein a buffer layer is formed between the substrate and the double heterostructure layers.

3. A light-emitting device as claimed in claim 1, wherein a reflective layer is formed between the substrate and the double heterostructure layers.

4. A light-emitting device as claimed in claim 1, wherein the active layer ahas a multi quantum well structure.

5. A light-emitting device as claimed in claim 1, wherein the double heterostructure layers are AlGaInP-based or AlGaAs-based double heterostructure, the first cladding layer is a first conductivity type layer, and the second cladding layer is a second conductivity type layer.

6. A light-emitting device as claimed in claim 1, wherein the substrate is a GaAs substrate.

7. A light-emitting device as claimed in claim 1, wherein the cap layer is made of GaP, GaAsP, GamnP, AlGaAs or AlGaInP.

8. A light-emitting device as claimed in claim 1, wherein the vacuum doughnut is located directly beneath the second electrode.

9. A light-emitting device as claimed in claim 1, wherein the vacuum doughnut layer is formed of AlInP, AlAs, GaInP, GaAlP, GaAsP, GaAs, InAlAs, InAlGaAs, InGaAsP, AlGaInP, AlGaAs or InP.

10. A light-emitting device using a vacuum doughnut to serve as a current-blocking layer comprising:

a semiconductor substrate of a first conductivity type; an electrode contact to the substrate;

active p-n junction layers formed on the other side of the substrate;

a cap layer of second conductivity type formed on the p-n junction layers;

a second electrode formed on the cap layer;

a vacuum doughnut comprises a flatwise vacuum cavity, formed between the p-n junction and the second electrode.

11. A light-emitting device as claimed in claim 10, wherein a buffer layer is formed between the substrate and the active p-n junction layers.

12. A light-emitting device as claimed in claim 10, wherein a reflective layer is formed between the substrate and the active p-n junction layers.

13. A light-emitting device as claimed in claim 10, wherein the active p-n junction layers are AlGaInP-based or AlGaAs-based p-n junction.

14. A light-emitting device as claimed in claim 10, wherein the substrate is a GaAs substrate.

15. A light-emitting device as claimed in claim 10, wherein the cap layer is made of GaP, GaAsP, GaInP, AlGaAs or AlGaInP.

16. A light-emitting device as claimed in claim 10, wherein the vacuum doughnut is located directly beneath the second electrode.

17. A light-emitting device as claimed in claim 10, wherein the vacuum doughnut layer is formed of AlInP, AlAs, GaInP, GaAlP, GaAsP, GaAs, InAlAs, InAlGaAs, InGaAsP, AlGaInP, AlGaAs or InP.

* * * * *